United States Patent [19]
Tanaka

[11] Patent Number: 5,479,458
[45] Date of Patent: Dec. 26, 1995

[54] DIGITAL PHASE SHIFTER INCLUDING 1/N FOR PHASE DETECT AND SUBSEQUENT VCO ADJUST

[76] Inventor: Yoshiaki Tanaka, 47-17, Kamiohkahigashi 1-chome, Konan-ku, Yokohama-shi, Kanagawa-ken, Japan

[21] Appl. No.: 318,549

[22] Filed: Oct. 5, 1994

[51] Int. Cl.$^6$ ................................................. H03D 3/24
[52] U.S. Cl. ........................ 375/376; 375/375; 329/307; 329/360; 327/244; 327/236
[58] Field of Search ............................... 375/120, 373, 375/374, 375, 376, 362, 327; 329/307, 360; 327/236, 244; 342/103

[56] References Cited

U.S. PATENT DOCUMENTS

| | | | |
|---|---|---|---|
| 4,059,842 | 11/1977 | Meacham | 358/150 |
| 4,642,573 | 2/1987 | Noda et al. | 329/50 |
| 4,677,395 | 6/1987 | Bakes | 331/25 |
| 4,816,769 | 5/1989 | Ma et al. | 329/50 |
| 4,993,048 | 2/1991 | Williams et al. | 375/97 |
| 5,160,900 | 11/1992 | Visuri | 331/18 |
| 5,162,746 | 11/1992 | Ghoshal | 328/155 |
| 5,208,546 | 5/1993 | Nagaraj et al. | 328/155 |
| 5,214,677 | 5/1993 | Mori | 375/120 |
| 5,254,958 | 10/1993 | Flach et al. | 331/10 |
| 5,259,007 | 11/1993 | Yamamoto | 375/120 |

Primary Examiner—Stephen Chin
Assistant Examiner—William Luther
Attorney, Agent, or Firm—Wenderoth, Lind & Ponack

[57] ABSTRACT

A digital phase shifter for phase-shifting a cyclic input signal includes first—third dividers 1, 4 and 8, first and second phase detectors 2 and 6, first and second voltage controlled oscillators (VCOs) 3 and 7, and a digital comparator 5. The input signal F(IN) and a clock signal F(VCO3) output from the first VCO3 are divided by N and M at the first and second dividers, respectively and phases of the divided signals are compared at the first phase detector 2, whereby the leading edges of the input and clock signals are synchronized. The second divider 4 also generates a count value (m) representing a cycle order number to the comparator, where it is compared with a preset value (φ) for determining the amount of phase shift, and an equate pulse EQ5 is generated when the compared values are the same. The second phase detector 6 compares phases of the equate pulse EQ5 and a divided signal obtained by dividing a second clock signal F(OUT) generated by the second VCO7 by N, whereby the second clock signal F(VCO7) becomes a phase-shifted signal of the input signal.

8 Claims, 7 Drawing Sheets

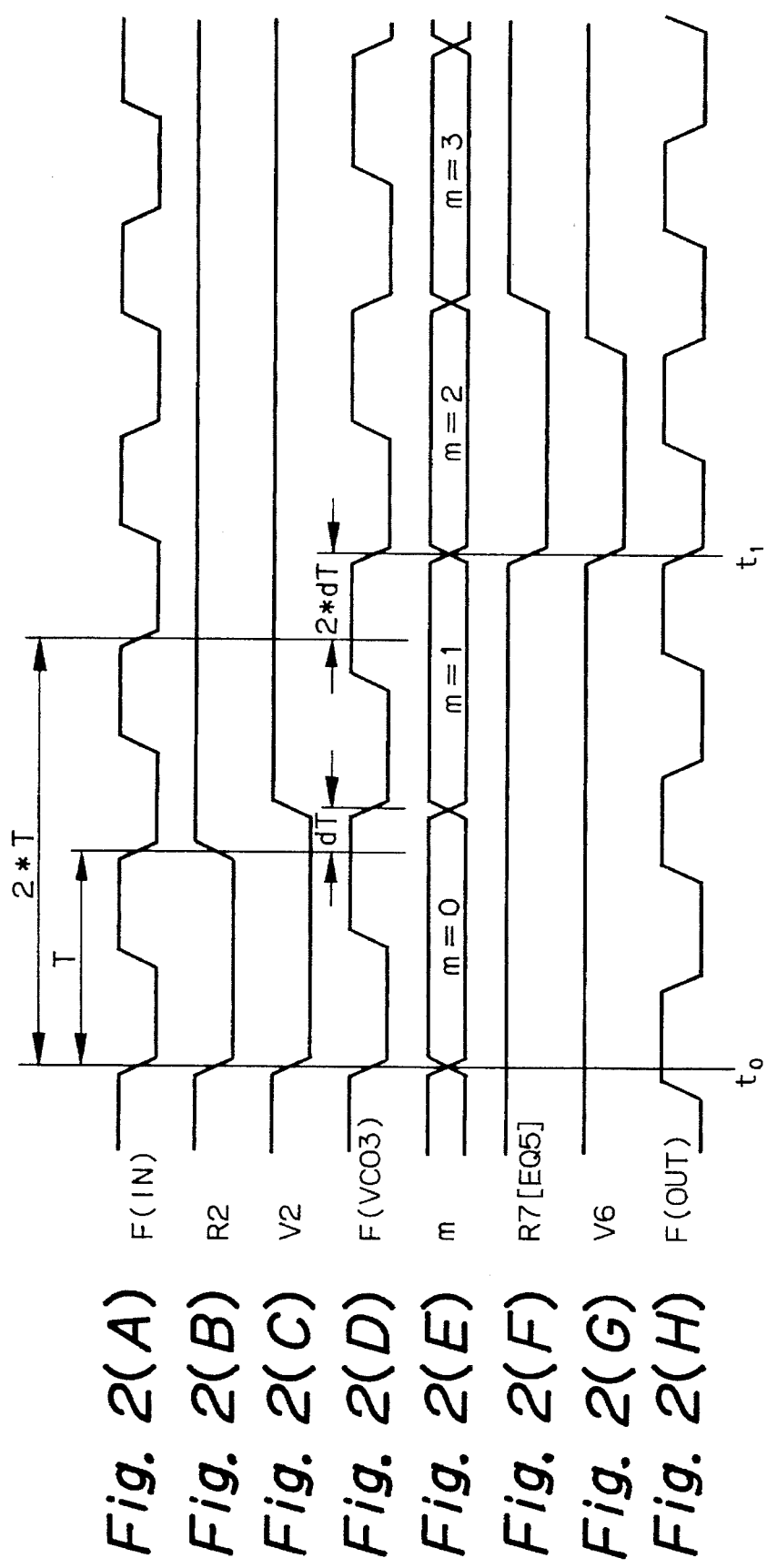

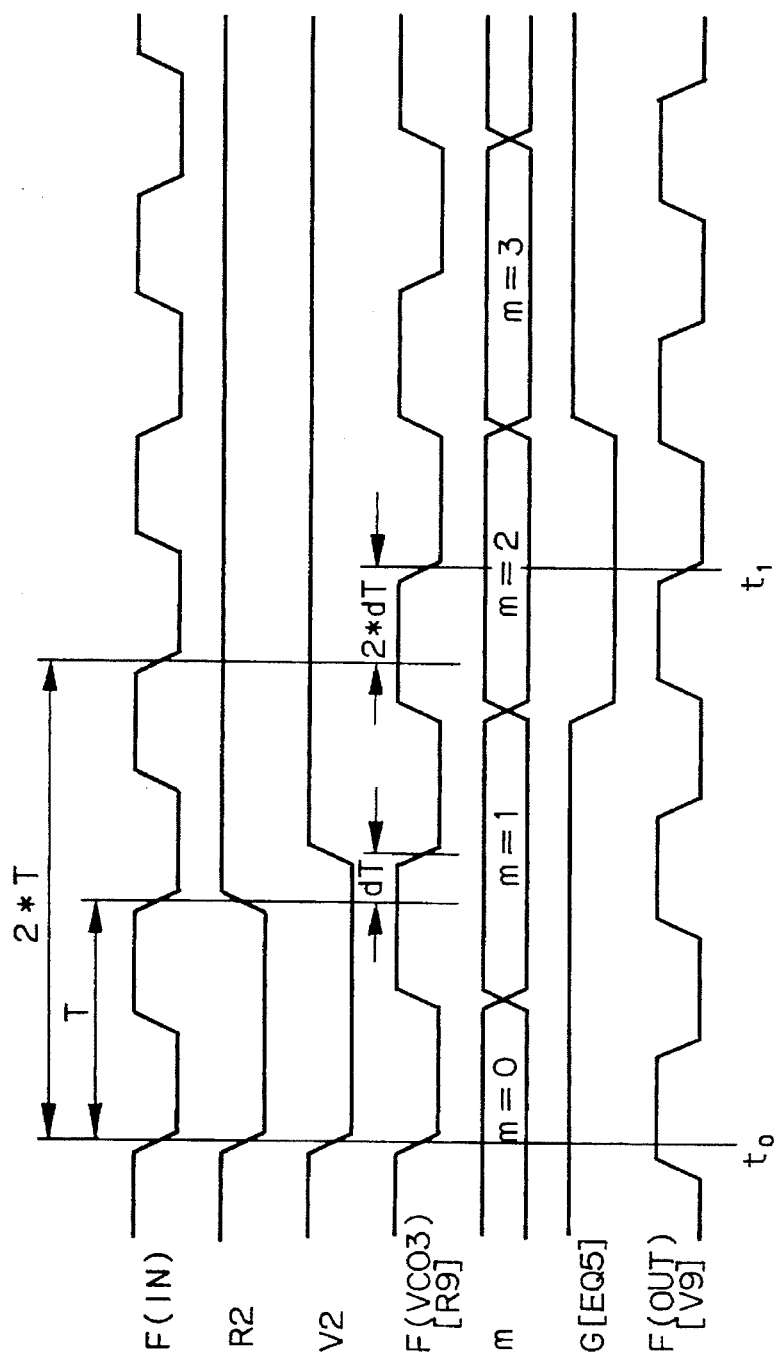

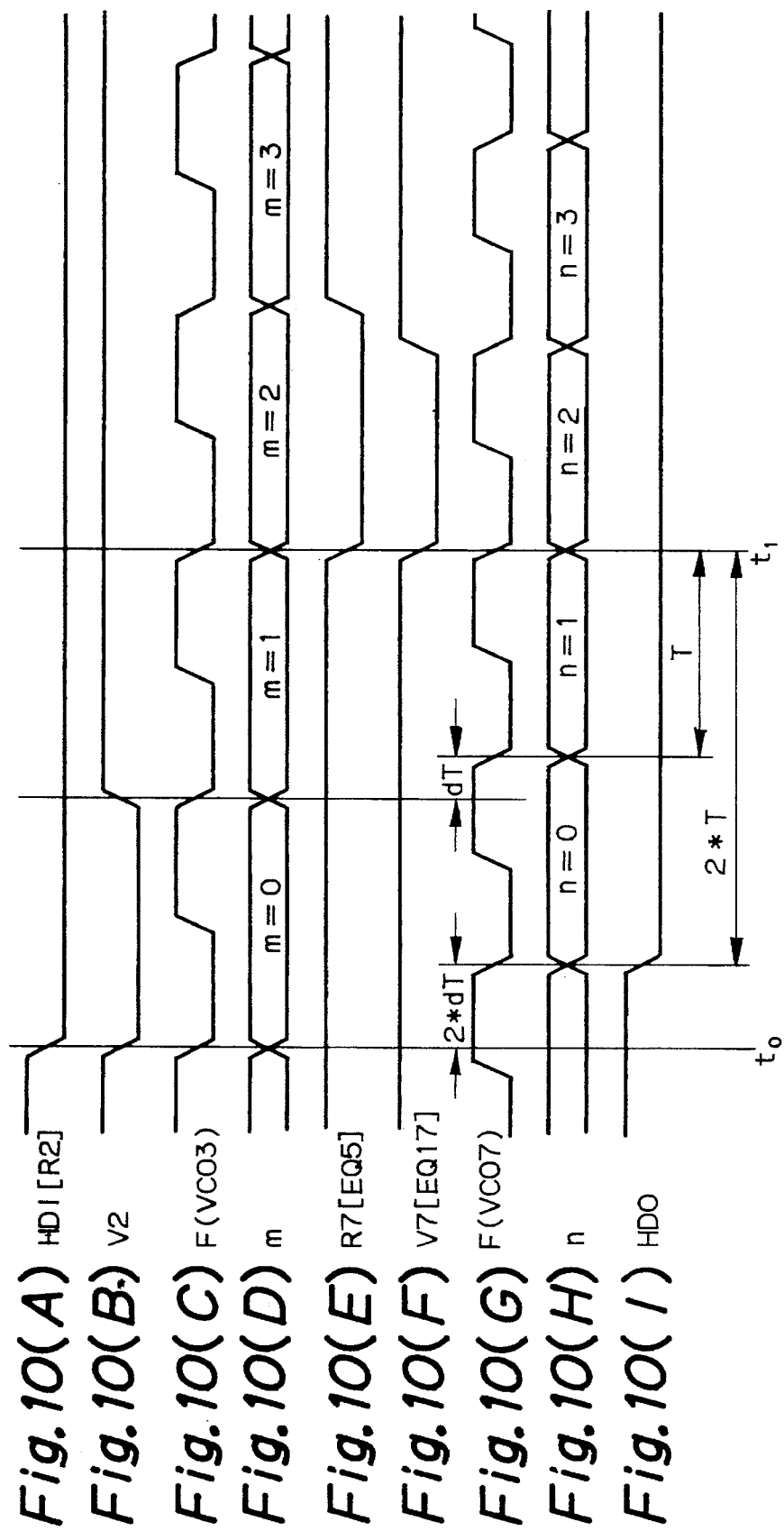

DIGITAL PHASE SHIFTER INCLUDING 1/N FOR PHASE DETECT AND SUBSEQUENT VCO ADJUST

BACKGROUND OF THE INVENTION

1. Field of the Invention

The present invention relates to a digital phase shifter, and more particularly to a digital device and method of generating a signal which is precisely phase-shifted from a reference input signal in an electronic device incorporated in a communication system, a measurement system, and so on.

2. Prior Art

A monostable multivibrator is known as an electronic analog phase-shift means, and a digital counter counting a clock signal is known as an electronic digital phase-shift means. Further, an electromechanical analog phase-shift means is known wherein a plurality of coils through which electric currents having different phases run are combined to generate a rotating magnetic field, in which a magnetic field detection coil that may be set at an optional angle is disposed.

The electronic analog phase-shift method employing a monostable multivibrator is not only susceptible to outside influences, such as change in ambient temperature and power source voltage, but is also unable to cope with an input signal having a high frequency. Even when the frequency of the input signal is not so high, if the amount of phase-shift is large, the analog phase-shift method is unable to cope therewith.

Furthermore, according to the electromechanical analog phase-shift method, it is difficult to accurately set a target phase due to a backlash of a bearing. Further, even though a target phase has been set, the set phase tends to vary because of a mechanical shock to a device including the rotating magnetic field generating coils and the magnetic field detecting coil.

Since the digital phase-shift method can overcome the problems of the analog phase-shift method, the digital phase-shift method needs to employ, when a sufficiently high phase shift accuracy is required, a clock signal having an extremely high frequency and a high speed counter, and thus, sometimes cannot be realized due to the necessity of the high frequency clock signal and high speed counter.

SUMMARY OF THE INVENTION

The object of the present invention is to provide a digital phase shifter free from the above-mentioned prior art problems.

In order to attain the object of the invention, a digital phase shifter for phase-shifting a cyclic input signal according to the present invention comprises: a first divider (1) for dividing pulses included in said input signal by a first predetermined value (N) to generate a first divided signal; a first phase detector (2) having first and second input terminals for comparing phases of said first divided signal provided to said first input terminal from said first divider and another signal provided to said second input terminal and for providing an output voltage corresponding to the phase difference therebetween; a first voltage controlled oscillator [VCO] (3) for generating a first clock signal the frequency of which varies in response to said output voltage of said first phase detector; a second divider (4) for dividing pulses included in said first clock signal by a second predetermined value (M) to provide a second divided signal to said second input terminal of said first phase detector, and for providing a count value (m) representing the cycle number of pulses of said first clock signal up to said second predetermined value, wherein the second predetermined value is slightly different from said first predetermined value; a digital comparator (5) for comparing said count value from said second divider with a first predetermined phase-shift value($\phi$), and generating a first equate pulse (EQ5) the level of which is a first logic level only when these are the same; a second phase detector (6) having first and second input terminals for comparing phases of said first pulse provided to said first input terminal and another signal provided to said second terminal thereof; a second voltage controlled oscillator [VCO] (7) for generating a second clock signal the frequency of which varies in response to an output of said second phase detector; and a third divider (8) for dividing pulses included in said second clock signal by said first predetermined value (N) to provide a third divided signal to said second input terminal of said second phase detector; whereby said output signal from said second VCO being a phase-shifted signal of said input signal.

In another aspect of the present invention, a second phase detector may have a gate terminal to which the equate pulse EQ5 is provided, and when the pulse is the first logic level, the second phase detector compares the first and second clock signals provided to first and second terminals thereof.

In further aspect of the present invention, a variable delay circuit for delaying the input signal based on the output from the phase detector having the gate terminal.

The present invention can be applied to a chrominance sub-carrier processing apparatus and a horizontal drive signal processing apparatus by adding some devices.

BRIEF DESCRIPTION OF THE DRAWINGS

These and other objects and advantages of the invention may be readily ascertained to the following description and appended drawings in which:

FIGS. 2(A)–2(H) are timing charts of waveforms for explaining an operation of the first embodiment;

FIGS. 5(A)–5(G) are timing charts of waveforms for explaining an operation of the second embodiment;

FIGS. 10(A)–10(I) illustrate timing charts of waveforms for explaining operations of the fifth and sixth embodiments.

DETAILED EXPLANATION OF THE INVENTION

Figure 1:
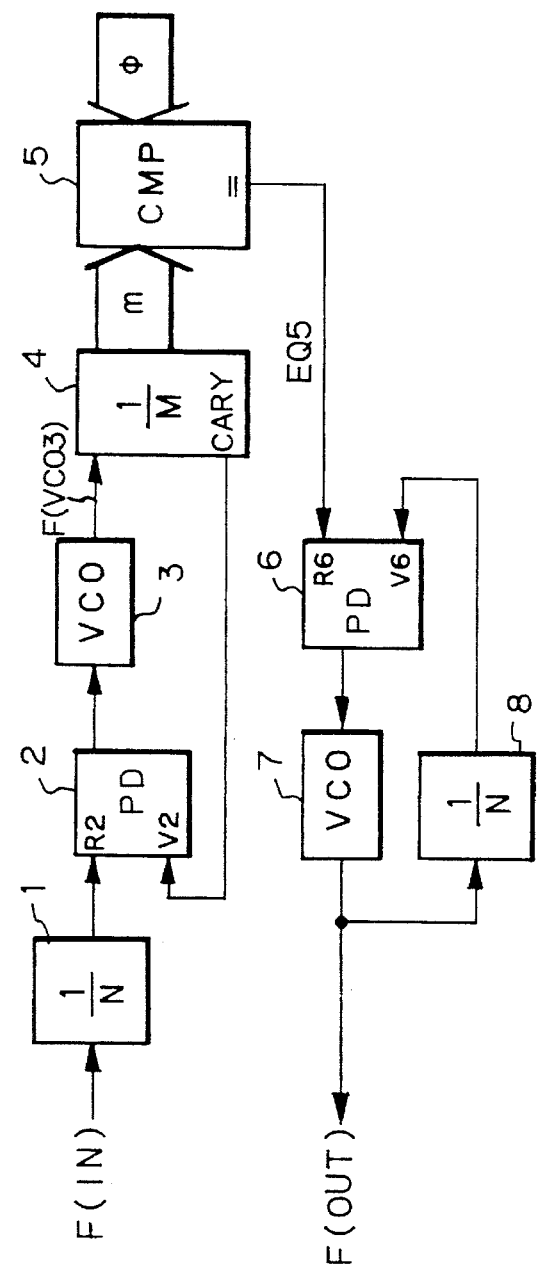
FIG. 1 shows a block diagram illustrating a first embodiment of the present invention.

FIG. 1 is a block diagram illustrating an embodied digital phase shifter according to the present invention, whereas FIGS. 2(A)–2(H) show timing charts of waveforms at the essential parts of the phase-shifter shown in FIG. 1. In FIG. 1, numeral 1 denotes a divider for dividing an input signal F(IN) having a cycle T by N to generate a divided signal, 2 a phase detector (PD) for comparing phases of signals input to reference and vary terminals R2 and V2 thereof to provide a voltage signal corresponding to the phase difference between the reference (R2) signal (or the divided signal from the divider 1) and the vary (V2) signal, 3 a voltage controlled oscillator (VCO) for outputting a clock signal F(VCO3) the frequency of which varies according to the voltage signal from the phase detector 2. Numeral 4 denotes a divider for dividing pulses of the clock signal F(VCO3) by M to generate a divided signal to the V2 terminal of the phase detector 2. Accordingly, the divided signal from the divider 4 becomes the V2 signal of the phase detector. The divider 4 also has a ring counter function to generate a count value m (m=0, 1, 2, 3, . . . , M-1) by counting the clock signal pulses of the F(VCO3). Numeral 5 denotes a digital comparator for comparing the value m and a preset value $\phi$ representing the amount of phase to be shifted, to generate an equate signal EQ5 the level of which is kept at an active level, for instance a low level, only when the value m and $\phi$ coincide. N and M are preset as slightly different from each other and are relatively large in order to obtain a high precision, as explained hereinbelow. The phase detector 2, VCO3, and divider 4 comprise a main phase lock loop (hereinafter referred to as MAIN-PLL).

Numerals 6, 7 and 8 denote a phase detector (PD), a voltage controlled oscillator (VCO) which generates an output signal F(OUT) and a divider for dividing pulses of the output signal F(OUT) from the VCO7 by N, respectively, these components forming an additional phase-lock loop (hereinafter referred to ADD-PLL I). The falling or front edge of the output signal F(OUT) is synchronized with that of the equate output EQ5 from the digital comparator 5.

The falling edges of the R2 and V2 signals input to the phase detector 2, that is, the phases of the divided signals generated by the dividers 1 and 4, are rendered synchronous with each other due to the operation of the MAIN-PLL, as shown in FIGS. 2(B) and 2(C) [at $t=t_0$]. When $t=t_0$, the falling edges of the signals F(IN), and F(VCO3) are also synchronized with each other, as shown in FIGS. 2(A) and 2(D). However, the phase difference between the signals F(IN) and F(VCO3) become larger with time as shown in FIGS. 2(A) and 2(D), since the dividing ratios N and M have been preset at slightly different values.

That is, at the start of the first cycle (m=0), i.e., $t=t_0$, the falling edge of the signal F(VCO3) is synchronized with that of the signal F(IN), while at the start of the next cycle (m=1), the falling edge of the signal F(VCO3) lags behind that of the signal F(IN) by dT, and at the beginning of the further next cycle (m=2), it lags by 2dT, as shown in FIGS. 2(A)–2(E).

Thus, a shift between the signals F(IN) and F(VCO3), that is a phase difference can be determined by designating the value m. Assuming that 2 is input as the phase shift amount $\phi$ ($\phi$=2), the equate signal EQ5 from the CMP5 changes its level to low at the time point $t_1=(t_0+2T+2dT)$ and keeps it during the third cycle (m=2) because the cycle of the signal F(IN) is T and the phase shifted difference between the signals F(IN) and F(VCO3) at $t=t_1$ is 2dT, as is clear from FIGS. 2(A)–2(F). The signal EQ5 is input to an input terminal of ADD-PLL I (or a reference terminal R6 of the phase detector 6). Accordingly, an output of the divider 8 (or a signal at a vary terminal V6 of the phase detector 6) is synchronized with the signal EQ5, and hence with the signal F(OUT) output from the ADD-PLL I (or VCO7) due to the operation of the ADD-PLL I. The phase of the signal F(OUT) from VCO7 is shifted from that of the signal F(IN) by 2dT, and has the same frequency of 1/T as the signal F(IN) because the dividing ratios of the dividers 1 and 8 are the same. That is, the output signal F(OUT) becomes a signal obtained by shifting the phase of the signal F(IN) by 2dT.

The cycles of the signal at the R2 and V2 terminals of the phase detector 2 are NT and M(T+dT), respectively. These cycles NT and M(T+dT) became the same due to the operation of the MAIN-PLL, as explained above. That is;

$$NT=M(T+dT)$$

Accordingly, dT is represented as follows;

$$dT=T(N-M)/M$$

From the above expression, it is obvious that the smaller the difference between N and M is and the larger M and hence N are, the smaller dT becomes, thereby the higher a phase difference setting precision is obtained. For example, when N=3601 and M=3600, dT is expressed as follows;

$$dT=T/3600$$

$$\therefore dT=0.1° (\because T=360°)$$

Therefore, a quite high phase shift precision is obtained.

In the case, M is slightly smaller than N. However, when M is slightly larger than N, a phase shift can be conducted in the same manner as described above except that dT assumes a negative value. For instance, when N=3599 and M=3600, dT=−0.1°.

Another embodiment of the present invention will next be explained by referring to FIGS. 3–5. In these drawings, the same components as those in FIGS. 1 and 2 are referred to by the same symbols as those in FIGS. 1 and 2 similarly (with regard to other embodiments hereinafter explained). In this second embodiment, a phase detector (PD) 9 having a gate terminal G is utilized instead of the no-gate terminal phase detector 6 and the divider 8 in the first embodiment. The gate terminal G receives the output signal EQ5 from the CMP5 and reference and vary terminals R9 and V9 of the phase detector 9 receive the signal F(VCO3) and F(OUT). The detector 9 and VCO7 forms a ADD-PLL I'. A detailed example of the constitution of the phase detector 9 is shown in FIG. 4, which is obtained by adding the gate terminal G to a conventional edge trigger type frequency/phase detector. The phase detector 9 is caused to execute the phase comparison operation only when the gate terminal G is kept at an active level, for example a low level in this case.

Figure 3:
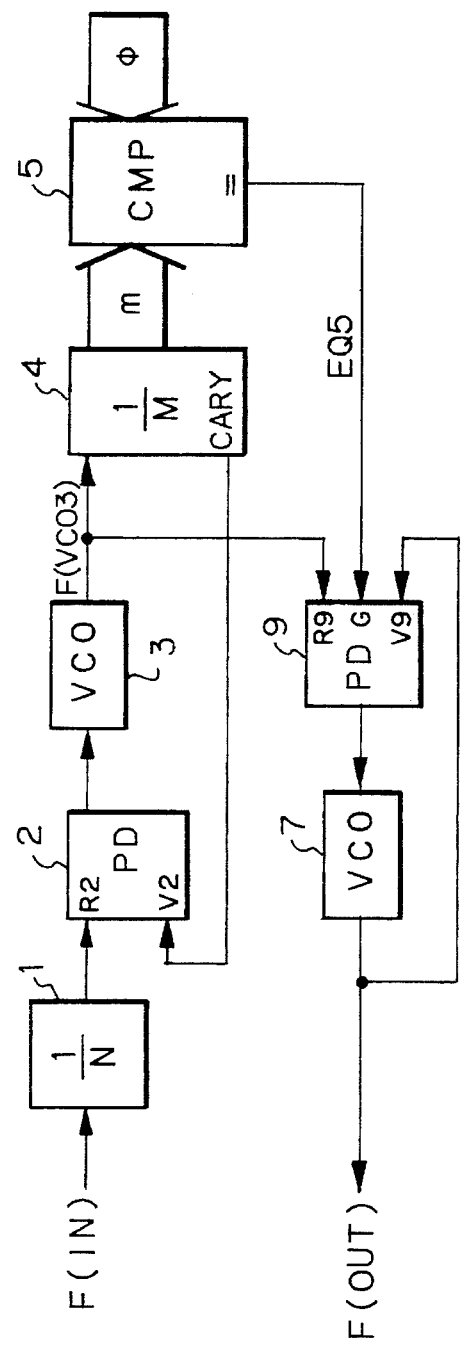
FIG. 3 shows a block diagram illustrating a second embodiment of the present invention.
Figure 4:
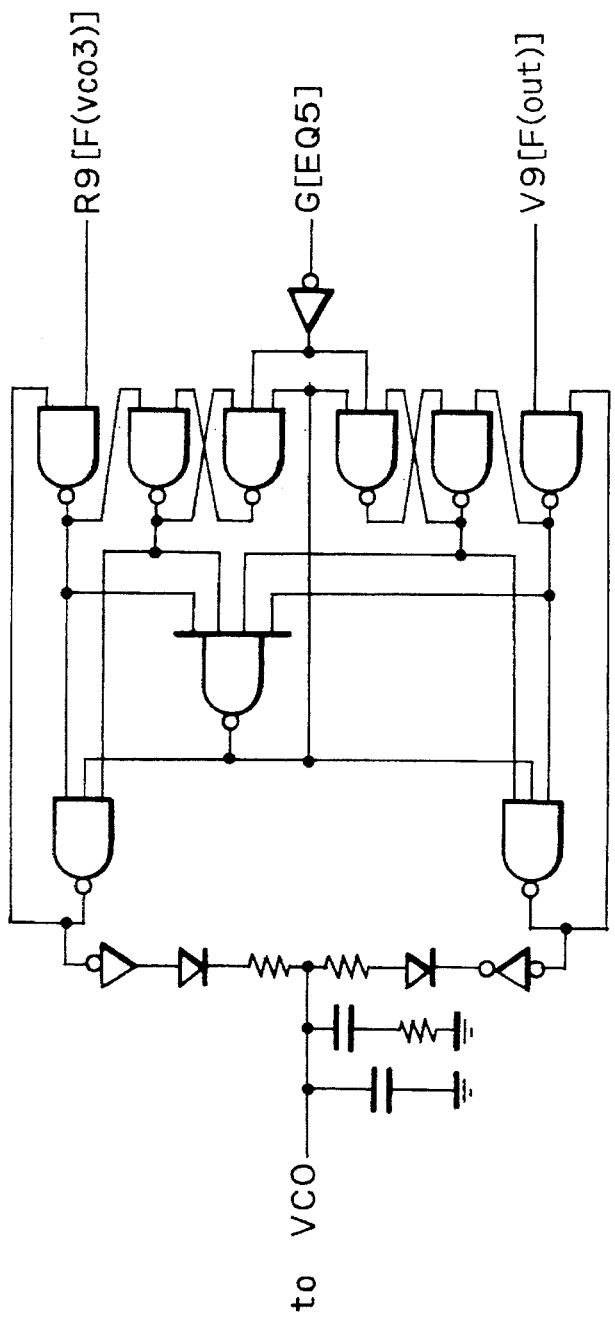
FIG. 4 illustrates a detailed constitution of a phase detector 9 with gate shown in FIG. 3.

FIGS. 5(A)–5(G) show waveforms at the essential parts of the phase shifter shown in FIG. 3. When $\phi$ is set to 2, the level of the signal EQ5 is low during a cycle of m=2, and thus the phase detector 9 is made active to compare the phases of the signals F(VCO3) and F(OUT), thereby making the phase of the signals F(VCO3) and F(OUT) coincident only at $t=t_1$.

Figure 6:
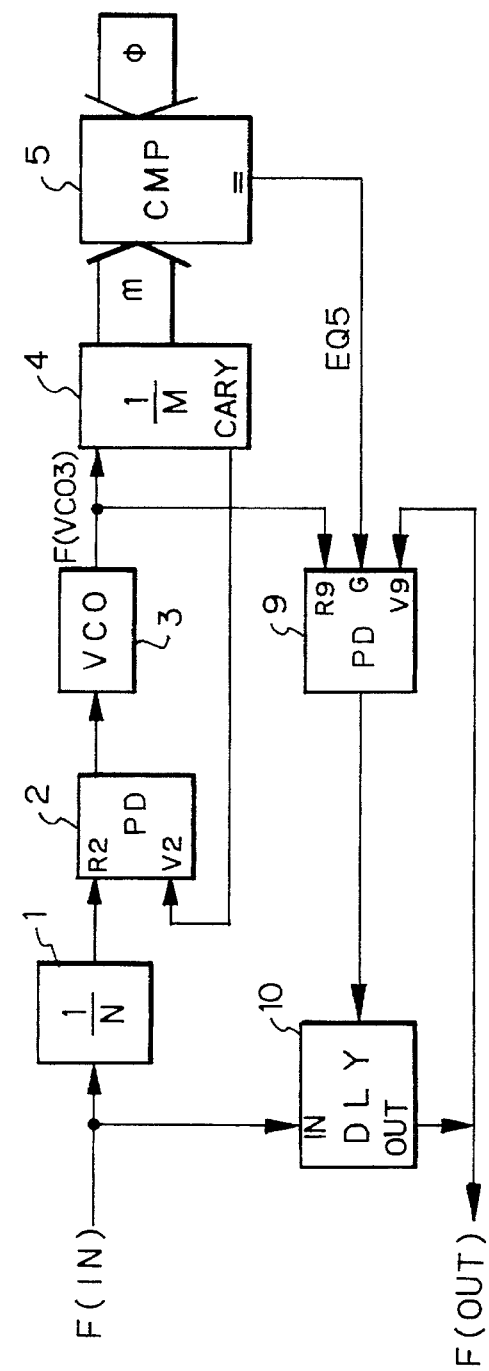
FIGS. 6–9 show block diagrams illustrating third—sixth embodiments of the present invention.

A third embodiment of the present invention is shown in FIG. 6, wherein a variable delay circuit 10 is employed instead of the VCO7 shown in FIG. 3. The variable delay circuit 10 receives the input signal F(IN) at its input terminal and provides the output signal F(OUT) from its output terminal. The basic operation of the third embodiment is similar to that of the second embodiment, and thus the waveforms in the third are the same as those in second shown in FIGS. 5(A)–5(G).

Figure 7:
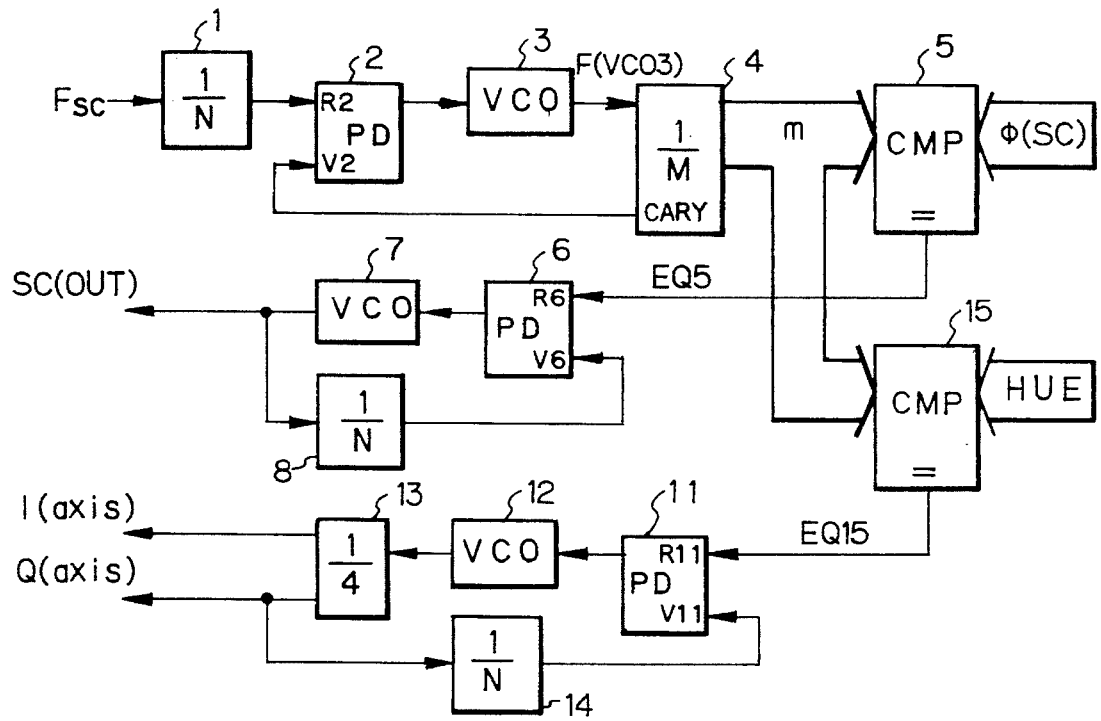

FIG. 7 shows a fourth embodiment of the present invention applied to a processing device for a chrominance signal of a color video signal. In FIG. 7, numeral 11-14 denote a phase detector having reference and vary terminals R11 and V11, a voltage controlled oscillator (VCO), a Johnson counter for dividing a signal input thereto from the VCO12 by 4, and a divider for dividing by N to generate a divided signal to the V11 terminal of the phase detector 11, respectively. The phase detector 11, VCO12, and divider 13 and 14 form a second additional phase lock loop (ADD-PLL II). Numeral 15 denotes a digital comparator (CMP). Fsc provided to the divider 1 denotes an input chrominance sub-carrier as a reference signal, φ(SC) provided to the CMP5 a phase shift amount of the sub-carrier Fsc to be phase-shifted, HUE provided to the CMP15 a HUE control amount, and SC(OUT) output from the ADD-PLL I (6-8) an output chrominance sub-carrier.

The CMP15 outputs an equate signal EQ15 the level of which is low only when the count value m and the value HUE are the same and provides the same to a reference terminal R11 of the phase detector 11. Johnson counter 13 outputs two signals I(axis) and Q(axis) which are different by 90° in phase. The signals I(axis) and Q(axis) are utilized as carriers which are quadrature-modulated by a chrominance-difference signal in a chrominance encoder (not shown), and thus the HUE thereof will be varied by a phase of the sub-carrier SC(OUT) output from the VCO7. The phase of the sub-carrier SC(OUT) is optionally set by the value φ(SC) provided to the CMP5, whereas the phases of the signals I(axis) and Q(axis) are optionally set by the value HUE provided to the CMP15.

Figure 8:
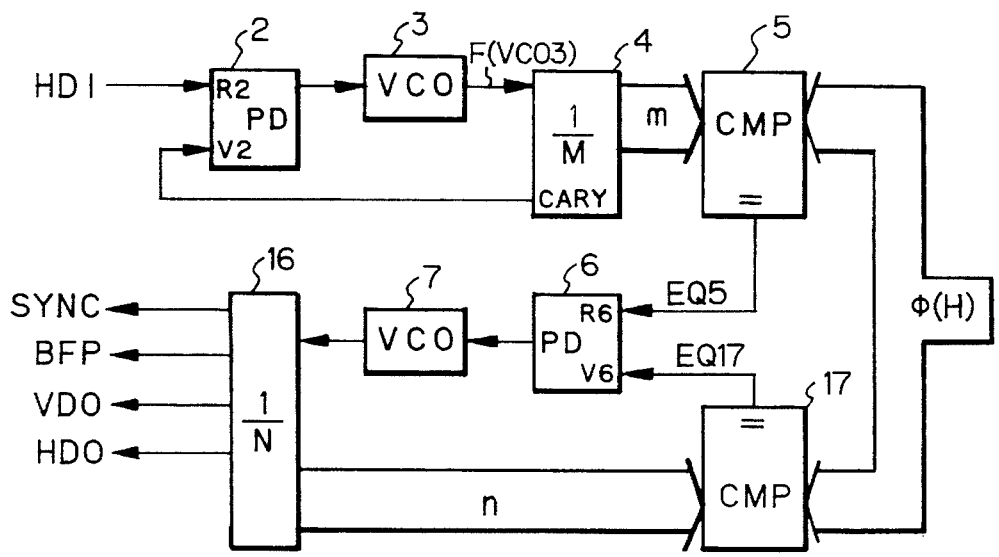

FIG. 8 illustrates a fifth embodiment of the present invention applied to an apparatus for processing a synchronization signal of a color video signal. In FIG. 8, numerals 16 and 17 denote a SYNC-generator and a digital comparator (CMP) 17. HDI input to the phase detector 2 denotes an input horizontal drive signal as a reference signal that is externally predivided by N, and φ(H) provided to the CMPs 5 and 17 a horizontal phase shift amount externally preset. The SYNC-generator 16 generates an output horizontal drive signal HDO obtained by dividing the output from the VCO7 by N, and a composite synchronization signal SYNC, a burst flag pulse BFP and an output vertical drive signal VDO based on the output of the VCO7. The SYNC-generator 16 further generates a count value n (n=0, 1, 2, ..., N−1) obtained by counting the clock output from the VCO7. The CMP17 compares the value n from the SYNC-generator 16 and the value φ(H) and generates an equate signal EQ17 to the V6 terminal of the phase detector 6, the level of which keeps low only during n=φ(H). The phase detector 6, VCO7, SYNC-generator 16 and digital comparator 17 comprise an additional phase lock loop (ADD-PLL I").

A detailed operation of the fifth embodiment will next be explained by referring to FIGS. 10(A)–10(I). The falling edges of the input signals to the phase detector 2, that is, the signals HDI and divided signal from the divider 4 are synchronized with each other at t=t₀ due to the operation of the MAIN-PLL, as shown in FIGS. 10(A) and 10(B). At t=t₀, the signals HDI and F(VCO3) are also synchronized each other as indicated in FIGS. 10(A) and 10(C).

Assuming that the preset amount of horizontal phase shift φ(H) is 2, the level of the signal EQ5 provided to the ADD-PLL I" is lowered during the third cycle (m=2) in the same manner as described with regard to FIGS. 1 and 2. Due to the operation of the ADD-PLL I", the falling edge of the signal EQ17 at the V6 terminal is also synchronized with that of the signal EQ5 at t=t₁. On the other hand, the level of the signal EQ17 is lowered when the value n is 2 because of the value φ(H)=2. That is, after two cycles of the signal F(VCO7) from the falling edge of the signal HDO, the level of the signal EQ17 becomes low, and maintains the low level during the cycle of n=2.

As described above, the falling edge of the signals FQ5 and FQ17 coincide at t=t₁, and thus the signals F(VCO3) and F(VCO7) are phase locked only thereat. Since the values N and M are set slightly different from each other, the phase of the signal HDO is shifted from that of the signal HDI by 2dT which is determined by the value φ(H), as shown in FIGS. 10(A)–10(I).

In the above, when the CMPs 5 and 17 receive different values φ(H₅) and φ(H₁₇), respectively, the phase-shift amount can be varied stepwisely by T.

Figure 9:
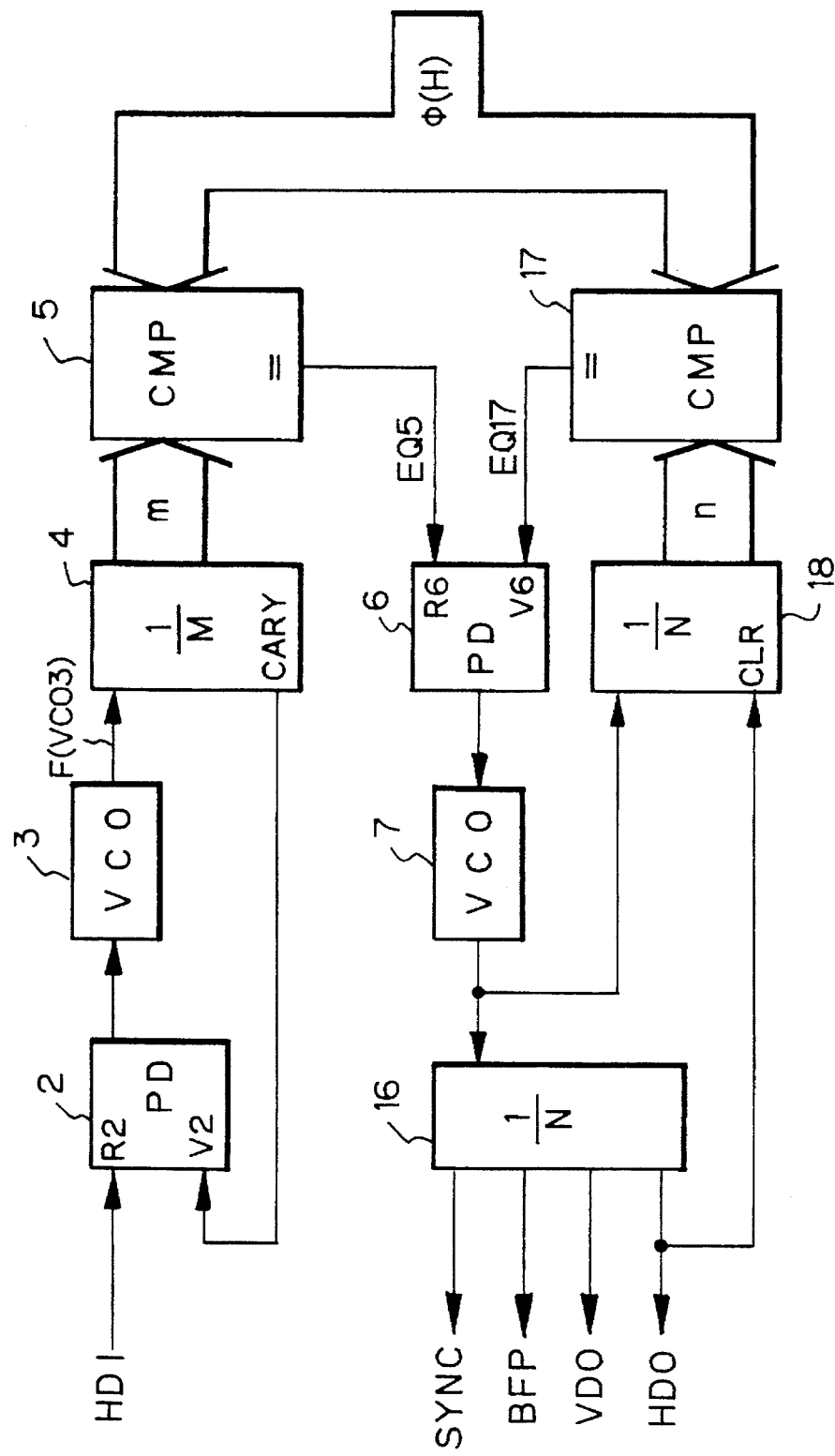

FIG. 9 shows a sixth embodiment, wherein a counter (or divider) 18 is added. The counter 18 counts the output of the VCO7 and is cleared by the horizontal drive output HDO, whereby the counter generates the count value n up to N to the digital comparator 17. This embodiment is useful in that when the SYNC-generator 16 is not constituted to output a count value n. Waveforms in the sixth embodiment are the same as those in the fifth embodiment, and thus FIGS. 10(A)–10(I) are referred to.

As is explained above, according to the present invention, it is possible to provide a digital phase shifter having a high phase shift precision simply by providing large dividing ratios N and M having a small difference therebetween. Thus, the digital phase shifter of the present invention does not need to employ a very high speed clock signal. Furthermore, it is not as susceptible to deterioration in accuracy and setting ability due to environmental changes as is an analog phase shifter. Since it is also able to provide an amount of phase shift in the form of digital data, it is free from setting difficulty and instability, which is a problem common to electrical and electromechanical methods.

It is further understood by those skilled in the art that the forgoing description is of preferred embodiments of disclosed devices and that various changes and modifications may be made in the invention without departing from the spirit and scope thereof.

What is claimed is:

1. A digital phase shifter for phase-shifting a cyclic input signal comprising:

a first divider for dividing pulses included in said cyclic input signal by a first predetermined value to generate a first divided signal;

a first phase detector having first and second input terminals for comparing a phase of said first divided signal provided to said first input terminal thereof from said first divider with a phase of a second divided signal provided to said second input terminal thereof, and for providing a first output voltage corresponding to the phase difference therebetween;

a first voltage controlled oscillator for generating a first clock signal the frequency of which varies in response to said first output voltage of said first phase detector;

a second divider for dividing pulses included in said first clock signal by a second predetermined value to provide said second divided signal to said second input terminal of said first phase detector, and for providing a count value representing a number of pulses of said first clock signal up to said second predetermined value, wherein the second predetermined value is different than said first predetermined value;

a first comparator for comparing said count value from said second divider with a first predetermined phase-shift value, and for generating a first equate pulse having a level which is an active level only when said count value and said first predetermined phase-shift value are the same;

a second phase detector having first and second input terminals for comparing a phase of said first equate pulse provided to said first input terminal thereof and a phase of a third divided signal provided to said second terminal thereof, and for providing a second output voltage corresponding to the phase difference therebetween;

a second voltage controlled oscillator for generating a second clock signal the frequency of which varies in response to said second output voltage of said second phase detector; and a third divider for dividing pulses included in said second clock signal by said first predetermined value to provide said third divided signal to said second input terminal of said second phase detector;

whereby said clock signal from said second voltage controlled oscillator is a phase-shifted signal of said cyclic input signal.

2. A digital phase shifter according to claim 1, wherein said cyclic input signal is a chrominance sub-carrier signal, and said first predetermined phase-shift value provided to said first comparator is a sub-carrier phase shift control amount.

3. A digital phase shifter according to claim 2, further comprising:

a second divider for comparing said count value from said second divider with a second predetermined phase-shift value representing a chrominance phase control amount, and for generating a second equate pulse having a level which is said active level only when said count value and said second predetermined phase-shift value are the same;

a third phase detector having first and second input terminals for comparing a phase of said second equate pulse provided to said first input terminal thereof from said second comparator and a phase of a fourth divided signal provided to said second input terminal thereof, and for providing a third output voltage corresponding to the phase difference therebetween;

a third voltage controlled oscillator for generating a third clock signal the frequency of which varies in response to said third output voltage of said third phase detector; and a Johnson counter for generating I and Q axes signals by dividing pulses included in said third clock signal by four; and a fourth divider for dividing pulses included in one of said I and Q axes signals by said first predetermined value to generate said fourth divided signal to said second input terminal of the third phase detector.

4. A digital phase shifter for phase-shifting a cyclic input signal comprising:

a first divider for dividing pulses included in said cyclic input signal by a first predetermined value to generate a first divided signal;

a first phase detector having first and second input terminals for comparing a phase of said first divided signal provided to said first input terminal thereof from said first divider and a phase of a second divided signal provided to said second input terminal thereof and, for providing a first output voltage corresponding to the phase difference therebetween;

a first voltage control oscillator for generating a first clock signal the frequency of which varies in response to said first output voltage of said first phase detector;

a second divider for dividing pulses included in said first clock signal by a second predetermined value to provide said second divided signal to said second input terminal of said first phase detector, and for providing a count value representing a number of pulses of said first clock signal up to said second predetermined value, wherein the second predetermined value is different than said first predetermined value;

a first comparator for comparing said count value from said second divider with a first predetermined phase-shift value, and for generating a first equate pulse having a level which is an active level only when said count value and said first predetermined phase-shift value are the same;

a second phase detector having first and second input terminals and a gate terminal for comparing a phase of said first clock signal from said first voltage controlled oscillator provided to said first input terminal thereof and a phase of a second clock signal provided to said second input terminal thereof only when said first equate pulse provided from said digital comparator to said gate terminal is said active level and for providing a second output voltage corresponding to a phase difference therebetween; and a second voltage controlled oscillator for generating said second clock signal the frequency of which varies in response to said second output voltage of said second phase detector;

whereby said second clock signal from said second voltage controlled oscillator is a phase-shifted signal of said cyclic input signal.

5. A digital phase shifter for phase-shifting a cyclic input signal comprising:

a first divider for dividing pulses included in said cyclic input signal by a first predetermined value to generate a first divided signal;

a first phase detector having first and second input terminals for comparing a phase of said first divided signal provided to said first input terminal thereof from said first divider and a phase of a second divided signal provided to said second input terminal thereof and, for providing first output voltage corresponding to the phase difference therebetween;

a first voltage control oscillator for generating a first clock signal the frequency of which varies in response to said first output voltage of said first phase detector;

a second divider for dividing pulses included in said first clock signal by a second predetermined value to provide said second divided signal to said second input terminal of said first phase detector, and for providing a count value representing a number of pulses of said first clock signal up to said second predetermined value, wherein the second predetermined value is different than said first predetermined value;

a first comparator for comparing said count value from said second divider with a first predetermined phase-shift value, and for generating a first equate pulse having a level which is an active level only when said count value and said first predetermined phase-shift value are the same;

a second phase detector having first and second input terminals and a gate terminal for comparing a phase of said first clock signal from said first voltage controlled oscillator provided to said first input terminal thereof and a phase of a second clock signal provided to said second input terminal thereof only when said first equate pulse provided from said digital comparator to said gate terminal is at said active level and for providing a second output voltage corresponding to a phase difference therebetween;

a variable delay circuit for delaying said cyclic input signal to output a delayed signal based on said second output voltage of said second phase detector;

whereby said delayed signal from said variable delay circuit is a phase-shifted signal of said cyclic input signal.

6. A phase shifter for phase-shifting a horizontal drive signal comprising:

a first phase detector having first and second input terminals for comparing a phase of said horizontal drive signal provided to said first input terminal thereof and a phase of a first divided signal provided to said second input terminal thereof and for providing a first output voltage corresponding to the phase difference therebetween;

a first voltage controlled oscillator for generating a first clock signal the frequency of which varies in response to said first output voltage of said first phase detector;

a first divider for dividing pulses included in said first clock signal by a first predetermined value to provide said first divided signal to said second input terminal of said first phase detector, and for providing a first count value representing a number of pulses of said first clock signal up to said first predetermined value;

a first comparator for comparing said count value from said first divider with a first predetermined phase-shift value, and for generating a first equate pulse having a level which is an active level only when said count value and said first predetermined value are the same;

a second phase detector having first and second input terminals for comparing a phase of said first equate signal from said first comparator provided to said first input terminal thereof and a phase of a second equate signal provided to said second input terminal thereof and for providing a second output voltage corresponding to the phase difference therebetween;

a second voltage controlled oscillator for generating a second clock signal the frequency of which varies in response to said second output voltage of said second phase detector;

a SYNC-generator for generating at least an output horizontal drive signal by dividing said second clock signal by a second predetermined value and for providing a second count value representing a number of pulses of said second clock signal, wherein the second predetermined value is different than said first predetermined value; and a second comparator for comparing said second count value with a second predetermined phase-shift value to provide said second equate pulse to said second input terminal of said second phase detector, wherein a level of said second equate pulse is said active level only when said second count value and said second predetermined phase-shift value are the same;

whereby said output horizontal drive signal from said SYNC-generator is a phase-shifted signal of said horizontal drive signal.

7. A phase shifter according to claim 6, wherein said SYNC-generator also generates a vertical drive signal, a synchronization signal and a burst flag pulse signal based on said second clock signal from said second voltage controlled oscillator.

8. A phase shifter according to claim 6, wherein said SYNC-generator includes a counter for counting pulses included in said second clock signal from said second voltage controlled oscillator, said counter being reset by a leading edge of said output horizontal drive signal.

* * * * *